United States Patent
Satoh

(10) Patent No.: US 7,071,598 B2
(45) Date of Patent: Jul. 4, 2006

(54) THIN AND HIGHLY STABLE PIEZOELECTRIC OSCILLATOR, AND THIN AND SURFACE-MOUNTING TYPE HIGHLY STABLE PIEZOELECTRIC OSCILLATOR

(75) Inventor: Tomio Satoh, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 45 days.

(21) Appl. No.: 10/900,743

(22) Filed: Jul. 28, 2004

(65) Prior Publication Data

US 2005/0023935 A1    Feb. 3, 2005

(30) Foreign Application Priority Data

Jul. 28, 2003  (JP)  .............................. 2003-202542
Apr. 6, 2004  (JP)  .............................. 2004-112142

(51) Int. Cl.
*H01L 41/08* (2006.01)
(52) U.S. Cl. ....................... 310/343; 310/341
(58) Field of Classification Search ........ 310/341–343, 310/346, 348
See application file for complete search history.

(56) References Cited

U.S. PATENT DOCUMENTS 6,049,256 A * 4/2000 Fry .............................. 331/69
6,133,674 A * 10/2000 Fry ............................ 310/343
6,147,565 A * 11/2000 Satoh et al. ................... 331/70
6,501,340 B1 * 12/2002 Flood ........................... 331/69

\* cited by examiner

*Primary Examiner*—Mark Budd
(74) *Attorney, Agent, or Firm*—Koda & Androlia

(57) ABSTRACT

A thin and highly stable piezoelectric oscillator is provided with a piezoelectric vibrator, a mother printed board which supports a piezoelectric vibrator main body on its one face and connects lead terminals to a wiring pattern, oscillating circuit parts which are mounted on one face of the mother printed board to be disposed in close contact with one face of the piezoelectric vibrator main body, adjusting circuit parts which are mounted on the other face of the mother printed board, an internal printed board which is provided in contact with the other face of the piezoelectric vibrator main body, and heater resistors which are mounted on the internal printed board to be disposed in close contact with the other face of the piezoelectric vibrator main body. Thus, since such a configuration is employed that, while the oscillating circuit parts mounted on the mother printed board are brought in close contact with the one face of a metal case of the piezoelectric vibrator, the heater resistors mounted on the flexible printed board are brought in close contact with the other face of the metal case for the piezoelectric vibrator, not only the heater resistors heat the piezoelectric vibrator but also it indirectly heats the oscillating circuit parts efficiently.

8 Claims, 5 Drawing Sheets

A—A

B—B

A—A

B—B

A—A

THIN AND HIGHLY STABLE PIEZOELECTRIC OSCILLATOR, AND THIN AND SURFACE-MOUNTING TYPE HIGHLY STABLE PIEZOELECTRIC OSCILLATOR

BACKGROUND OF THE INVENTION

1. Field of the Invention

The present invention relates to a piezoelectric oscillator used as a frequency controlling device or the like, and in particular to a thin and highly stable piezoelectric oscillator configured such that a piezoelectric vibrator is heated by a heater and the temperature of the heater is controlled by a temperature controlling circuit, where thinning to an almost extreme extent can be achieved without using such an oven as a metal block and various requirements including stability of an oscillation frequency, a low power consumption, improvement in assembling easiness and cost reduction are simultaneously satisfied.

2. Description of the Related Art

As such a piezoelectric oscillator as a quartz oscillator which is a frequency controlling device used in mobile communication equipment or transmission communication equipment, an oven type piezoelectric oscillator which can output a highly stable frequency without being affected by an external temperature change has been conventionally known. Recently, in these technical fields, since each equipment is required to be reduced in size and weight and be portable, the oven type piezoelectric oscillator is also required to be reduced in size and weight from the market correspondingly. That is, the height of the conventional oven type piezoelectric oscillator is usually 20 mm or more. In some cases, an oven type piezoelectric oscillator as big as up to about 50 mm in height is frequently used. In recent years, however, it is strongly required to reduce the oven type piezoelectric oscillator down to a height equal to that of a large-sized part so as to correspond to miniaturization of each equipment. At present, the thinnest one of oven type piezoelectric oscillators which have been developed by the inventor of the present application has a height of 9.2 mm, but an even more thinner oven type piezoelectric oscillator is required from the market. The conventional oven type piezoelectric oscillator is configured for obtaining a highly stable frequency such that a piezoelectric vibrator is received in a recess portion of such an oven as metal block having a large heat capacity and the metal block is heated to a predetermined temperature by a heater. However, since the bulk of the whole oscillator increases by using a metal block with a large size, the requirement such as reduction in size or weight can not be satisfied. Further, since such a configuration is employed that a piezoelectric vibrating element inside a piezoelectric vibrator is heated via the metal block, there is a problem that it takes time until heat from the heater is conducted to the piezoelectric vibrating element so that a desired frequency is obtained.

For example, a conventional oven type piezoelectric oscillator of a surface mounting type (disclosed in FIG. 5 of Japanese Laid-open application publication No. 2001-274626) has such a configuration that such a piezoelectric vibrator as a quartz vibrator and a printed board on an oscillator side are received sideways in a metal block (oven) and a heater wire is wound on an outer face of the metal block. The metal block is fixed on a mother printed board mounted with oscillating circuit parts on a top face through a predetermined gap, and the metal block and the mother printed board are received in a metal case. The metal case is mounted on a printed board on an equipment main body side by utilizing lead members projecting from a bottom portion of the metal case. Current is supplied to the circuit parts from the lead members via a wiring pattern on the mother printed board and current is supplied to the piezoelectric vibrator or the heater wire. However, in the oven type piezoelectric oscillator of this type, since the height of the metal block itself to be used is large and the metal block is fixed in a floating manner from the top face of the mother printed board, the thickness of the main body of the oven type piezoelectric oscillator becomes considerably large as compared with the thickness of the piezoelectric vibrator. Therefore, the height of the whole oscillator becomes large.

Next, as an oven type piezoelectric oscillator which has been further thinned without using a heater wire (disclosed in FIG. 6 of the Japanese Laid-open application publication No. 2001-274626) such an oscillator that a piezoelectric vibrator is disposed in a lying state so as to contact with a heater resistor mounted on a top face of a mother printed board mounted with circuit parts on its lower face, the piezoelectric vibrator is covered with a metal block whose lower face is opened toward the piezoelectric vibrator and these constituent elements are enclosed in a metal case has been proposed. The oven type piezoelectric oscillator of this type can be configured such that the thickness of the piezoelectric vibrator approximates roughly to the thickness of the main body of the oven type piezoelectric oscillator, but the limit of the height obtained by such a configuration will be 9.2 mm at the most, and further reduction in height will be impossible. A thick metal block made of aluminum alloy or the like is still required in order to heat the piezoelectric vibrator, which results in a factor for inhibiting size and height reduction. Further, since oscillating circuit parts are mounted on a lower face of the mother printed board, some of the oscillating circuit parts are not only separated from the heater but also they approach to a bottom base of the metal case. Therefore, temperature change of the oscillating circuit parts becomes large due to increase in heat dissipation which results in adverse affection on temperature characteristics of the oscillator. In order to stabilize the temperature characteristics of the oscillator, though it is important to stabilize not only the temperature of the piezoelectric vibrator but also the temperature of the oscillating circuit parts, the oven type piezoelectric oscillator does not have a configuration satisfying such a requirement.

In order to solve these problems to achieve further thinning, the present inventor have proposed, in the Japanese Laid-open application publication No. 2001-274626, a surface mounting type thin and highly stable piezoelectric oscillator in which a piezoelectric vibrator is fitted into a notch formed in a mother printed board to achieve thinning corresponding to the thickness of the mother printed board, these constituent elements are respectively enclosed from both surface and back sides by a flexible printed board, heater resistors mounted on the flexible printed board are brought in close contact with both the surface and back of the piezoelectric vibrator, and these constituent elements are enclosed in a case. The piezoelectric oscillator has achieved thinning up to 6.2 mm successfully.

However, in the piezoelectric oscillator described above, since the heater resistors mounted on the flexible printed board are brought in close contact with both the surface and back of the piezoelectric oscillator, the oscillating circuit parts mounted on the mother printed board and the heater resistors take a positional relationship where they are separated from each other, which interferes with stability of a heating temperature of the oscillating circuit parts. Further, since a capacitor and the like serving as adjusting circuit parts are mounted on the mother printed board whose surface and back surface have been blocked by the flexible printed board, it becomes impossible to adjust the adjusting circuit parts after assembling has been completed.

It is an object of the present invention to provide a thin and highly stable piezoelectric oscillator configured such that a temperature of a heater is controlled by a temperature control circuit, where thinning to an almost extreme extent can be achieved without using such an oven as a metal block causing size-enlargement and various requirements including stability of an oscillation frequency, a low power consumption, improvement in assembling easiness and cost reduction are simultaneously satisfied.

Further, another object of the present invention is to provide a thin and highly stable piezoelectric oscillator where characteristics are stabilized by heating not only a piezoelectric vibrator but also oscillating circuit parts by a heater resistor sufficiently, and adjusting work can be implemented arbitrarily by exposing adjusting circuit parts externally.

SUMMARY OF THE INVENTION

In order to solve the above problem, a first aspect of the present invention provides a thin and highly stable piezoelectric oscillator, comprising: a piezoelectric vibrator provided with a piezoelectric vibrator main body where a piezoelectric vibrating element is sealed in a metal case in an air-tight manner and lead terminals projecting from a bottom portion of the piezoelectric vibrator main body; a mother printed board which supports the piezoelectric vibrator main body on one face and connects the lead terminals to a wiring pattern; an oscillating circuit part which is mounted on one face of the mother printed board to be arranged so as to closely contact with the one face of the piezoelectric vibrator main body; an adjusting circuit part which is mounted on the other face of the mother printed board; an internal printed board which is provided in contact with the other face of the piezoelectric vibrator main body; and a heater resistor which is mounted on the internal printed board to be arranged so as to closely contact with the other face of the piezoelectric vibrator main body.

A second aspect of the present invention provides the thin and highly stable piezoelectric oscillator according to the first aspect, wherein the internal printed board is a flexible printed board, and one end of the flexible printed board extends to the one face of the mother printed board.

A third aspect of the present invention provides the thin and highly stable piezoelectric oscillator according to any one of the first or the second aspect, wherein the heater resistor is connected and fixed to a face of the internal printed board in advance.

According to a fourth aspect of the present invention provides the thin and highly stable piezoelectric oscillator according to any one of the first, the second or the third aspects, wherein a configuration where a metal plate box is assembled to the mother printed board so as to enclose an outer face of the piezoelectric vibrator main body including a portion of the internal printed board is provided.

According to a fifth aspect of the invention provides a surface mounting type thin and highly stable piezoelectric oscillator in which the thin and highly stable piezoelectric oscillator according to any one of the first, the second, the third or the fourth aspects, is mounted on a base printed board for surface mounting, and a space on the base printed board, including the thin and highly stable piezoelectric oscillator is enclosed in an oscillator case made of metal.

A sixth aspect of the present invention provides the surface mounting type thin and highly stable piezoelectric oscillator according to the fifth aspect, wherein electrical connection among the base printed board, the internal printed board and the mother printed board is secured with at least one conductive pin.

DETAILED DESCRIPTIONS

Figure 1B:
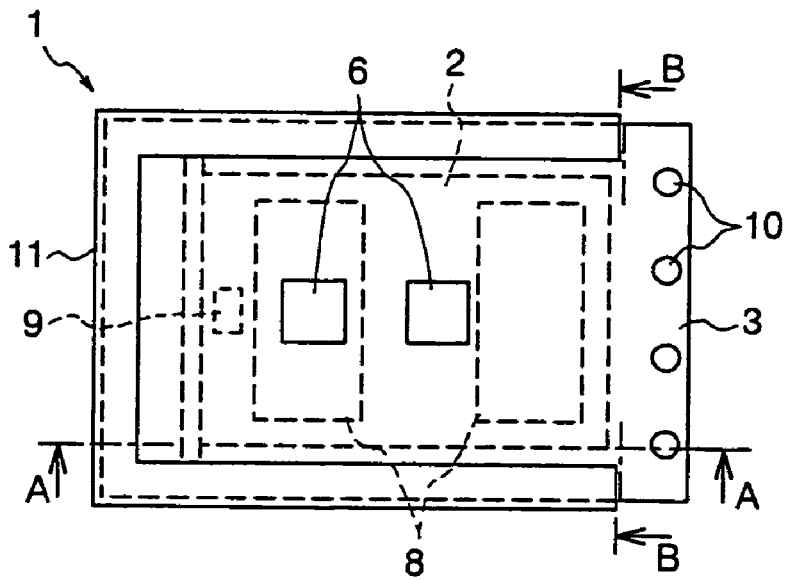
FIGS. 1A, 1B and 1C are a front vertical sectional view, a plan view and a side vertical sectional view of a thin and highly stable piezoelectric oscillator according to one embodiment of the present invention.
Figure 1C:
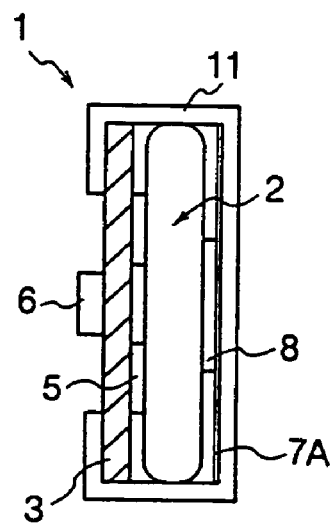
Figure 1A:
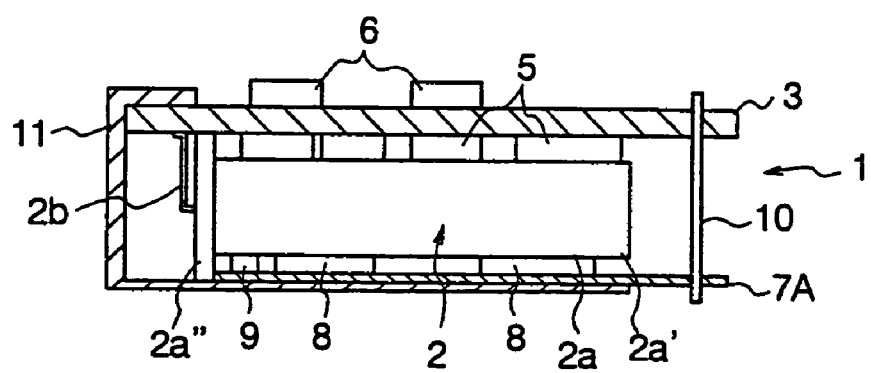
Figure 2B:
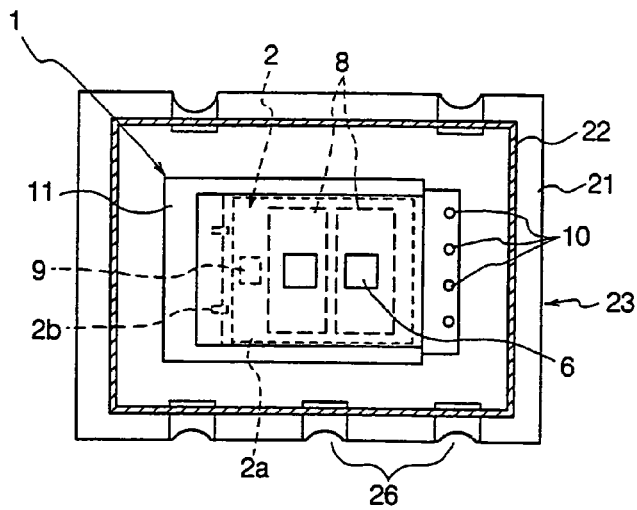
FIGS. 2A and 2B are a front vertical sectional view and a plan view of a surface mounting type thin and highly stable piezoelectric oscillator.
Figure 2A:
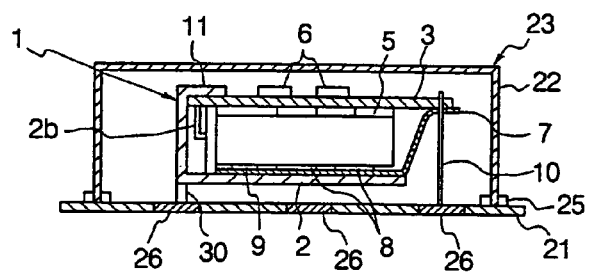
Figure 3A:
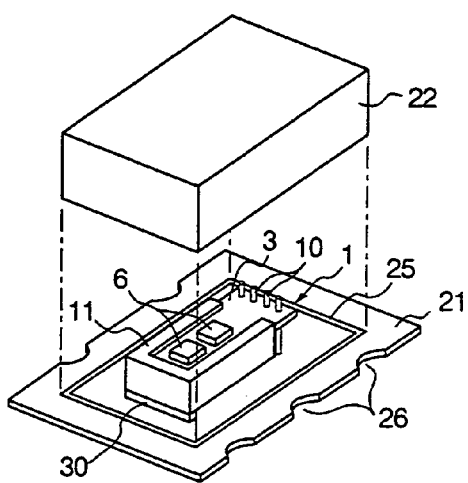
FIGS. 3A and 3B are exploded perspective views of the surface mounting type thin and highly stable piezoelectric oscillator.
Figure 3B:
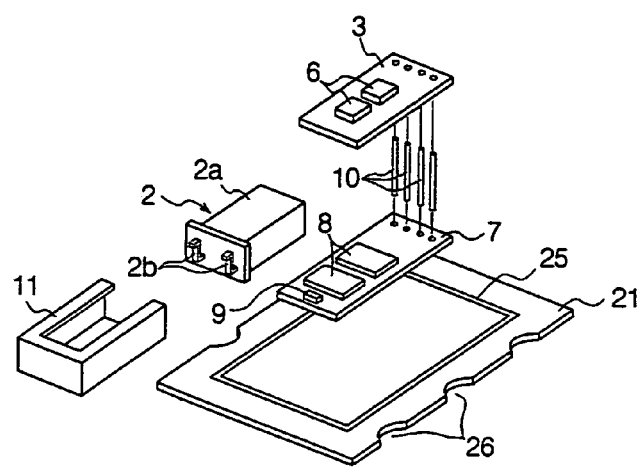

The present invention will be explained in detail based on exemplary embodiments shown in the drawings. FIG. 1A is a vertical sectional view showing an internal configuration of a thin and highly stable piezoelectric oscillator according to one embodiment of the present invention, FIG. 1B is a plan view thereof, and FIG. 1C is a right side view thereof. FIGS. 2A and 2B are a vertical sectional view of a surface mounting type thin and highly stable piezoelectric oscillator and a plan view of a main portion thereof. FIGS. 3A and 3B are exploded perspective views of the surface mounting type thin and highly stable piezoelectric oscillator.

A thin and highly stable piezoelectric oscillator 1 is mainly provided with a piezoelectric vibrator 2 such as a quartz vibrator including a piezoelectric vibrator main body 2a where a piezoelectric vibrating element is sealed in a metal case in an air-tight manner and lead terminals 2b projecting from a bottom portion of the piezoelectric vibrator main body 2a, a mother printed board 3 which mounts the piezoelectric vibrator 2 on a lower face thereon in a lying manner and electrically connects the lead terminals 2b to wiring patterns, oscillating circuit parts 5 which are mounted on a lower face of the mother printed board 3 and arranged so as to closely contact with an upper face of the piezoelectric vibrator main body 2a, adjusting circuit parts 6 such as a capacitor, which are mounted on an upper face of the mother printed board 3, and a flexible printed board (for example, having a thickness of 0.1 mm) 7 which is provided in contact with a lower face side of the piezoelectric vibrator main body 2a and extends to the lower face of the mother printed board 3. The flexible printed board (an internal printed board) 7 is constituted by forming a wiring pattern on a flexible sheet, and it is mounted on an upper face thereof with heater resistors 8 arranged in close contact with the lower face of the piezoelectric vibrator main body 2a, and a thermistor 9 arranged near the heater resistors.

One end of the flexible printed board 7 together with the mother printed board 3 is penetrated by conductive pins 10 in a state that it has been disposed in a contact with a lower face of the mother printed board 3 near an edge portion thereof, so that electrical connection among respective wiring patterns is secured. Further, an assembling work can be facilitated and productivity can be improved.

The heater resistors 8 are connected and fixed to a face of the flexible printed board 7 in advance. When the flexible printed board is assembled to the piezoelectric vibrator 2, the heater resistors 8 are fixed to a lower face of the piezoelectric vibrator main body 2a using, for example, adhesive.

Furthermore, a metal plate box (an oven case) 11 is assembled and fixed to the mother printed board 3 so as to enclose an outer face of the piezoelectric vibrator main body 2a including a portion of the flexible printed board 7 (a portion which is mainly provided in contact with the lower face of the piezoelectric vibrator main body 2a).

The metal plate box 11 is obtained by forming a thin and inexpensive metal plate in a box shape, and assembling is performed as shown in the drawings so that, while the heaters 8 on the flexible printed board 7 and the oscillating circuit parts 5 are brought in close contact with both faces of the piezoelectric vibrator main body 2a, the piezoelectric vibrator 2 is fixed and integrated to the mother printed board 3. A joining portion between the metal plate box 11 and the flexible printed board 7 or the mother printed board 3 may be fixed using adhesive, as necessary.

As well known, circuit parts used for the piezoelectric oscillator include the oscillating circuit parts 5, temperature controlling circuit parts and the like. The temperature controlling circuit controls heat generation of the heater resistors 8 based on a detected temperature obtained by such a temperature detecting element as the thermistor 9 or the like to keep the temperature of the piezoelectric vibrator 2 constant.

The capacitor used as one of the adjusting circuit parts 6 can be used, for example, as a part for adjustment of an oscillation frequency or adjustment for temperature control.

The piezoelectric vibrator 2 is provided with the piezoelectric vibrator main body 2a having a configuration where a piezoelectric vibrating element (an element forming an exciting electrode on a piezoelectric substrate), not shown, is air-tightly sealed in a metal case 2a' and the lead terminals 2b air-tightly penetrating the interior of the metal case 2a' in an insulated manner therefrom to electrically conduct to exciting electrodes of the piezoelectric vibrating element.

Since a flange portion 2a" is generally formed in a projecting manner on an outer periphery of a bottom portion of the metal case 2a' of the piezoelectric vibrating main body, when the piezoelectric vibrator 2 is mounted on a lower face of the mother printed board 3 in a lying manner, as shown in FIGS. 1A, 1B and 1C, the flange portion 2a" abuts on the mother printed board 3 so that a gap is formed between the mother printed board 3 and an upper face of the metal case 2a'. In the present invention, since the oscillating circuit parts 5 are accommodated and disposed by utilizing this gap, the thickness can be reduced correspondingly. Further, since another gap is also formed between a lower face of the metal case 2a' and an upper face of the flexible printed board 7 by contacting the flange portion 2a" and the flexible printed board 7, the heater resistors 8 can be accommodated and disposed in this gap so that further thinning can be achieved.

Since the oscillating circuit parts 5 and the heater resistors 8 are disposed so as to closely contact with the metal case 2a' of the piezoelectric vibrator main body 2a at upper and lower positions of the metal case 2a' in a sandwiching manner, the oscillating circuit parts 5 are sufficiently heated by heat conduction via the metal case 2a' so that temperatures thereof can be stabilized.

Further, a heat retaining property can be improved by the flexible printed board 7 and the metal plate box 11.

The highly stable piezoelectric oscillator 1 where the piezoelectric vibrator 2, the mother printed board 3 mounted with the circuit parts 5, 6, and the flexible printed board 7 mounted with the heater resistors 8 are integrated by the metal plate box 11 in this manner is mounted on a surface mounting type base printed board 21 shown in FIGS. 2A, 2B and 3A, 3B, and a surface mounting type highly stable piezoelectric oscillator 23 can be fabricated by enclosing a space defined on the base printed board 21 and including the highly stable piezoelectric oscillator 1 in a metal oscillator case 22.

That is, an earth pattern 25 for soldering connection where a skirt portion of the metal oscillator case 22 is seated is formed on an upper face of the base printed board 21 in advance, and external electrodes 26 for surface mounting on a printed board on an equipment main body side are formed at a peripheral portion of the base printed board 21.

The highly stable piezoelectric oscillator 1 is fixed at a portion of the metal case 2a' on the base printed board 21 via a fixing part 30 in a floating manner on the earth pattern and the like, and the conductive pins 10 penetrating the mother printed board 3 and the flexible printed board 7 are connected to the wiring patterns on the base printed board 21.

Since the metal case 2a' maintains in a non-contacting state with the base printed board 21, and the metal oscillator case 22, heat inside the oscillator is prevented from leaking externally.

Figure 4:
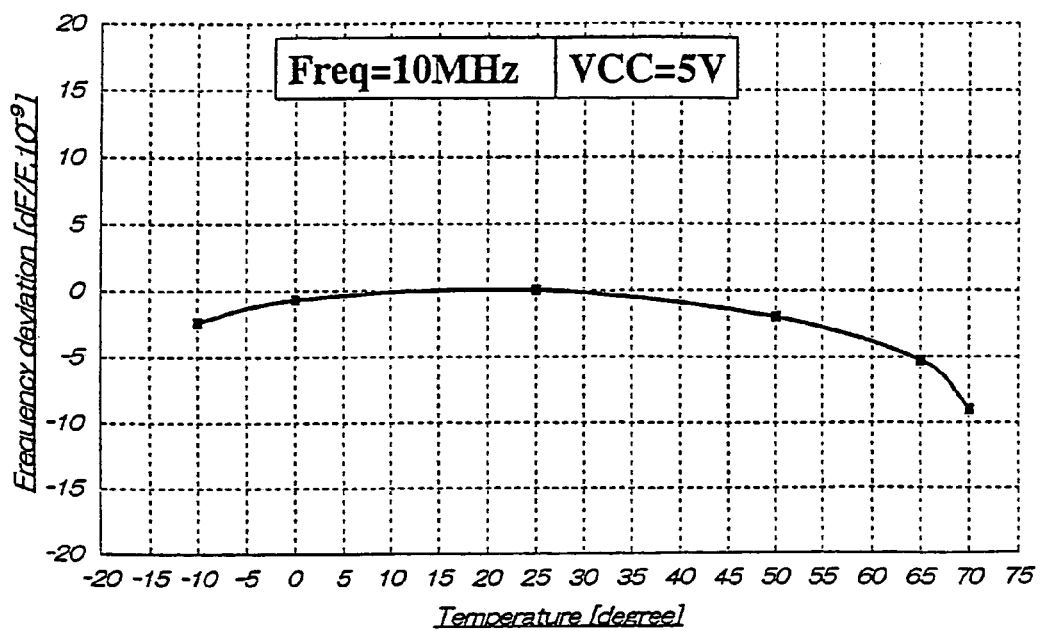
FIG. 4 is a graph showing a relationship between an ambient temperature and a frequency deviation of an oscillator of the present invention.

FIG. 4 is a graph showing "ambient temperature versus frequency deviation" characteristics in the highly stable piezoelectric oscillator of the present invention.

According to the highly stable piezoelectric oscillator 1 of the present invention, the temperature-frequency characteristics thereof shows values equal to or better than that obtained by the conventional highly stable piezoelectric oscillator shown in FIG. 6 in the Japanese Laid-open application publication No. 2001-274626.

Figure 5:
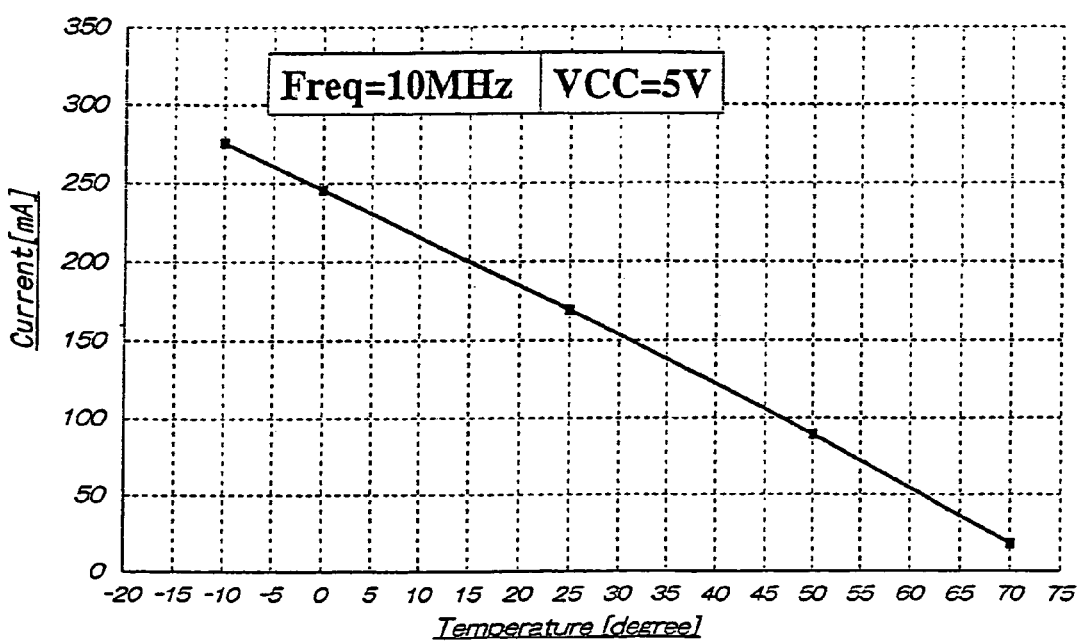
FIG. 5 is a graph showing a relationship between an ambient temperature and a consumption current of the oscillator of the present invention.

FIG. 5 is a graph showing "ambient temperature versus consumption current" characteristics in the oscillator of the present invention.

According to the highly stable piezoelectric oscillator 1 of the present invention, the consumption power is about 0.8 W at a room temperature, and it is about ½ of the consumption power of the conventional oscillator shown in FIG. 6 in the Japanese Laid-open application publication No. 2001-274626.

Thus, in the present invention, while a temperature retaining effect similar to that obtained by an oven is exerted, stabilization of an oscillation frequency and reduction in consumption power can be achieved without using such an oven as a metal block causing size-enlargement and height increase, thinning to almost extreme extent can be attained, and various requirements including improvement in assembling easiness and cost reduction can be satisfied simultaneously.

Further, the oscillating circuit parts which are other circuit parts whose temperature control is required are efficiently conducted with heat from the heater resistors for heating the piezoelectric vibrator.

Moreover, since the circuit-parts to be adjusted after assembly are exposed externally and arranged so as not be concealed by the flexible printed board and the mother printed board, adjustment can be made before the metal oscillator case 22 is mounted to the base printed board 21. In addition, in case that re-adjustment is required after the metal oscillator case is mounted, such adjustment can be conducted easily after the case is detached from the base printed board 21.

Figure 6B:
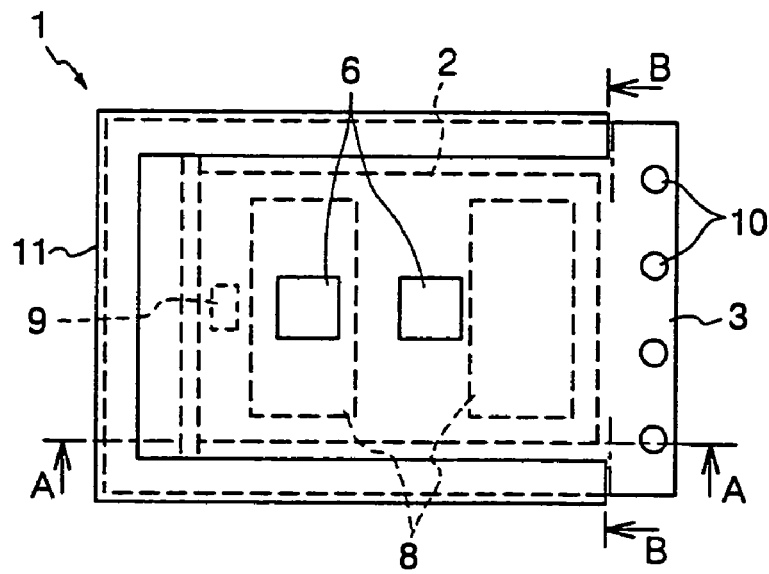
FIGS. 6A, 6B and 6C are a front vertical sectional view, a plan view and a side vertical sectional view of a thin and highly stable piezoelectric oscillator according to another embodiment of the present invention.
Figure 6C:
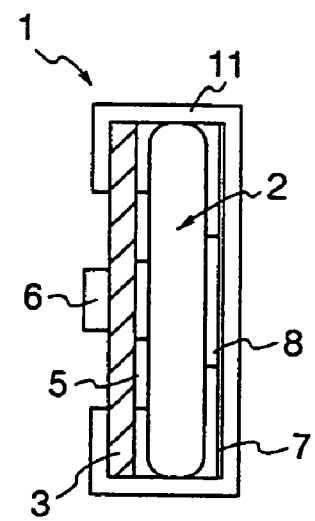
Figure 6A:
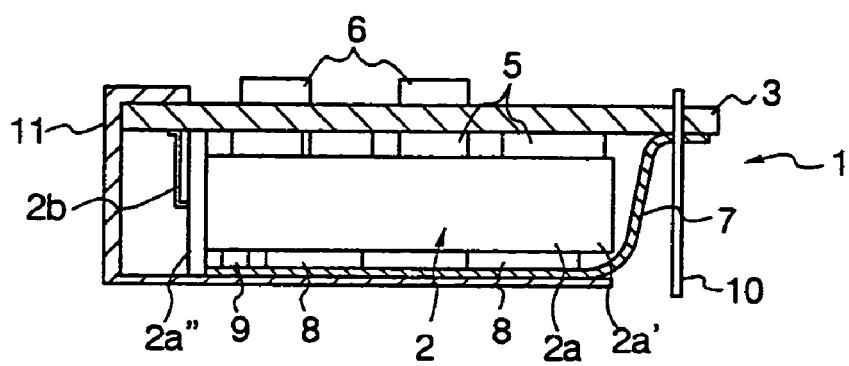

FIGS. 6A, 6B and 6C are a front vertical sectional view, a plan view and a side vertical sectional view of a thin and highly stable piezoelectric oscillator according to a modified embodiment of the thin and highly stable piezoelectric oscillator shown in FIGS. 1A, 1B and 1C.

A difference between the thin and highly stable piezoelectric oscillator according to the modified embodiment and the embodiment shown in FIGS. 1A to 1C lies in that a hard printed board 7A having a thin insulating material (for example, glass epoxy) having rigidity as a base material is used instead of the flexible printed board 7 serving as the internal printed board. Since the hard printed board 7A is substantially as thin as the flexible printed board 7 but it does not have flexibility, one end thereof can not be extended to the lower face of the mother printed board 3. For this reason, the one end of the hard printed board 7A is extended in a direction of a plane thereof and it is retained by the pins 10.

Accordingly, the other constituent elements of this modified embodiment are equivalent to those of the oscillator shown in FIGS. 1A to 1C.

Figure 7B:
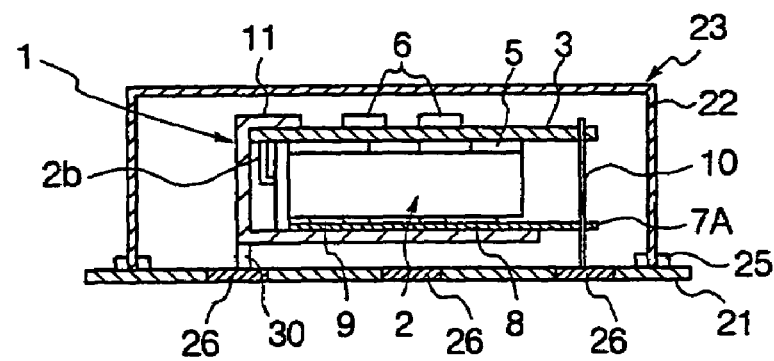
FIGS. 7A and 7B are a front vertical sectional view and a plan view of a surface mounting type thin and highly stable piezoelectric oscillator according to another embodiment of the present invention.
Figure 7A:
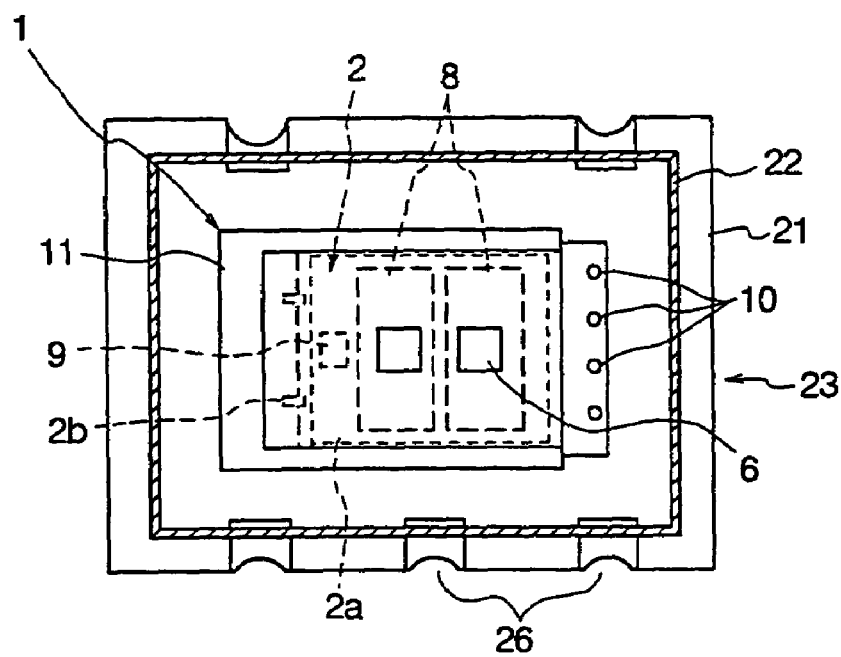

FIGS. 7A and 7B are a front vertical sectional view and a plan view of a surface mounting type thin and highly stable piezoelectric oscillator according to a modified embodiment corresponding to the embodiment shown in FIGS. 2A and 2B. The surface mounting type thin and highly stable piezoelectric oscillator according to this modified embodiment has the thin and highly stable piezoelectric oscillator shown in FIGS. 6A and 6B configured for surface mounting. That is, the embodiment shown in FIGS. 7A and 7B is different from the embodiment shown in FIGS. 2A and 2B in a point that the hard printed board 7A is used instead of the flexible printed board 7. The other constituent elements of this embodiment are equivalent to those of the oscillator shown in FIGS. 2A and 2B.

That is, in the present invention, not only the flexible printed board 7 but also the hard printed board 7A can be used as the internal printed board.

As described above, according to the present invention, there can be provided a thin and highly stable piezoelectric oscillator configured such that a temperature of a heater is controlled by a temperature controlling circuit, where thinning to an almost extreme extent can be achieved without using such an oven as a metal block causing size-enlargement and various requirements including stability of an oscillation frequency, a low power consumption, improvement in assembling easiness and cost reduction are simultaneously satisfied.

That is, in the present invention, since the oscillating circuit part mounted on the mother printed board is brought in close contact with one face of the metal case for the piezoelectric vibrator, while the heater resistor mounted on the thin internal printed board (which is a thin hard printed board having rigidity or a flexible printed board) is brought in close contact with the other face of the metal case for the piezoelectric vibrator, not only the heater resistor can heat the piezoelectric vibrator but also it can indirectly heat the oscillating circuit part efficiently. In addition, since the oscillating circuit part is accommodated in the closed space defined by the mother printed board, the internal printed board and the metal plate box, heat retaining property can be increased, which results in improvement in temperature characteristics.

Further, the adjusting circuit part is disposed so as to be exposed from an outer face of the mother printed board, it may be adjusted at any time.

Since the conductive pins are used as means for electrically connecting the thin internal printed board and the mother printed board to the base printed board, an assembling work is facilitated so that productivity can be improved.

The invention claimed is:

1. A thin and highly stable piezoelectric oscillator comprising:
   a piezoelectric vibrator provided with a piezoelectric vibrator main body where a piezoelectric vibrating element is sealed in a metal case in an air-tight manner and lead terminals projecting from a bottom portion of the piezoelectric vibrator main body;
   a mother printed board which supports the piezoelectric vibrator main body on one face and connects the lead terminals to a wiring pattern;
   an oscillating circuit part which is mounted on one face of the mother printed board to be arranged so as to closely contact with the one face of the piezoelectric vibrator main body;
   an adjusting circuit part which is mounted on the other face of the mother printed board;
   an internal printed board which is provided in contact with the other face of the piezoelectric vibrator main body; and
   a heater resistor which is mounted on the internal printed board to be arranged so as to closely contact with the other face of the piezoelectric vibrator main body.

2. The thin and highly stable piezoelectric oscillator according to claim 1, wherein the internal printed board is a flexible printed board, and one end of the flexible printed board extends to the one face of the mother printed board.

3. The thin and highly stable piezoelectric oscillator according to any one of claim 1 or 2, wherein the heater resistor is connected and fixed to a face of the internal printed board in advance.

4. The thin and highly stable piezoelectric oscillator according to any one of claim 1 or 2, wherein a configuration in which a metal plate box is assembled to the mother printed board so as to enclose an outer face of the piezoelectric vibrator main body including a portion of the internal printed board is employed.

5. A surface mounting type thin and highly stable piezoelectric oscillator, wherein the thin and highly stable piezoelectric oscillator according to any one of claim 1, 2, 3 or 4 is mounted on a base printed board for surface mounting, and a space on the base printed board, including the thin and highly stable piezoelectric oscillator is enclosed in an oscillator case made of metal.

6. The surface mounting type thin and highly stable piezoelectric oscillator according to claim 5, wherein electrical connection among the base printed board, the internal printed board and the mother printed board is secured with at least one conductive pin.

7. The thin and highly stable piezoelectric oscillator according to claim 3, wherein a configuration in which a metal plate box is assembled to the mother printed board so as to enclose an outer face of the piezoelectric vibrator main body including a portion of the internal printed board is employed.

8. A surface mounting type thin and highly stable piezoelectric oscillator, wherein the thin and highly stable piezoelectric oscillator according to claim 7 is mounted on a base printed board for surface mounting, and a space on the base printed board, including the thin and highly stable piezoelectric oscillator is enclosed in an oscillator case made of metal.

* * * * *